United States Patent
Hsu

(10) Patent No.: US 10,070,546 B1
(45) Date of Patent: Sep. 4, 2018

(54) BENDABLE DISPLAY APPARATUS AND SUPPORTING DEVICE

(71) Applicant: FIRST DOME CORPORATION, New Taipei (TW)

(72) Inventor: An-Szu Hsu, New Taipei (TW)

(73) Assignee: FIRST DOME CORPORATION, New Taipei (TW)

( * ) Notice: Subject to any disclaimer, the term of this patent is extended or adjusted under 35 U.S.C. 154(b) by 0 days.

(21) Appl. No.: 15/817,680

(22) Filed: Nov. 20, 2017

(30) Foreign Application Priority Data

May 19, 2017 (TW) .............................. 106207212 U

(51) Int. Cl.
| | | |
|---|---|---|
| *G06F 1/16* | (2006.01) | |
| *H05K 5/02* | (2006.01) | |
| *H05K 5/00* | (2006.01) | |
| *E05D 11/10* | (2006.01) | |
| *E05D 7/00* | (2006.01) | |
| *E05D 3/06* | (2006.01) | |

(52) U.S. Cl.
CPC .............. *H05K 5/0226* (2013.01); *E05D 3/06* (2013.01); *E05D 7/00* (2013.01); *E05D 11/1028* (2013.01); *H05K 5/0017* (2013.01); *E05Y 2900/606* (2013.01)

(58) Field of Classification Search
CPC .. H05K 5/0017; H05K 5/0226; H05K 7/1409; E05D 3/06; E05D 5/10; E05D 7/00; E05D 11/1028; G06F 1/1681; H04M 1/0216
See application file for complete search history.

(56) References Cited

U.S. PATENT DOCUMENTS

| | | | | |
|---|---|---|---|---|
| 8,813,312 B2* | 8/2014 | Song | ...................... | G06F 1/1601 16/225 |
| 9,013,864 B2* | 4/2015 | Griffin | ................ | H04M 1/0216 16/382 |
| 9,047,055 B2* | 6/2015 | Song | ......................... | E05D 3/14 |
| 2014/0174226 A1* | 6/2014 | Hsu | .......................... | E05D 3/122 74/98 |
| 2016/0048174 A1* | 2/2016 | Hsu | ........................ | G06F 1/1681 16/342 |
| 2016/0090763 A1* | 3/2016 | Hsu | ........................... | E05D 3/06 16/354 |

\* cited by examiner

*Primary Examiner* — Hoa C Nguyen
*Assistant Examiner* — Christopher L Augustin
(74) *Attorney, Agent, or Firm* — Li & Cai Intellectual Property (USA) Office

(57) ABSTRACT

A bendable display apparatus includes a carrying plate, two supporting devices disposed on an inner side of the carrying plate, and a bendable display mounted on an outer side of the carrying plate. Each supporting device includes a hinge module and two buffering modules respectively arranged on two opposite sides of the hinge module. Each buffering module includes an internal connecting member fixed on the hinge module, an external connecting member fixed on the carrying plate and slidably disposed on the internal connecting member, a driving member driven by a spiral track of the hinge module, and a transmitting member driven by the driving member for moving the external connecting member. When the hinge modules are bent, each supporting device is a curved structure and arranged inside of the bendable display, and each external connecting member slides relative to the corresponding internal connecting member toward the hinge module.

10 Claims, 16 Drawing Sheets

US 10,070,546 B1

BENDABLE DISPLAY APPARATUS AND SUPPORTING DEVICE

BACKGROUND OF THE INVENTION

1. Field of the Invention

The present disclosure relates to a display apparatus; in particular, to a bendable display apparatus and a supporting device.

2. Description of Related Art

When the conventional supporting device is outwardly bent, the total length of the hinge module of the conventional supporting device is not changed, and a plate mounted on an outer surface of the conventional supporting device is deformed because the hinge module stretches the plate. That is to say, when a soft display mounted on the outer surface of the conventional supporting device is outwardly bent, the soft display is easily broken because the hinge module of the conventional supporting device stretches the soft display.

SUMMARY OF THE INVENTION

The present disclosure provides a bendable display apparatus and a supporting device to effectively overcome the drawbacks associated with conventional supporting devices.

The present disclosure discloses a bendable display apparatus including two supporting devices, a carrying plate, and a bendable display. Each of the two supporting devices includes a hinge module and two buffering modules. The hinge module includes a plurality of pivots and a plurality of torsion units. The pivots are parallel to each other and are arranged in a row. Two spiral tracks are respectively recessed on two opposite portions of the pivots. The torsion units are sleeved on the pivots. Two positioning portions are respectively arranged on two opposite portions of the torsion units. The two buffering modules are respectively arranged at two opposite sides of the row of the pivots and respectively fixed on the two positioning portions. The two buffering modules are respectively corresponding in position to the two spiral tracks. Each of the two buffering modules includes an internal connecting member, an external connecting member, a transmitting shaft, and a driving member. The internal connecting member is fixed on the corresponding positioning portion. The external connecting member is slidably disposed on the internal connecting member. The transmitting shaft has a gearing portion and a fixing portion. The gearing portion is pivotally connected to the internal connecting member, and the fixing portion is connected to the external connecting member. The driving member has a rack gear and a guiding portion. The rack gear is engaged with the gearing portion, and the guiding portion is arranged in the corresponding spiral track. In each of the two supporting devices, the hinge module is bendable between an unfolded position and an outwardly folded position along at least one of the pivots. When the hinge module is at the unfolded position, the supporting device is a flat structure. When the hinge module is at the outwardly folded position, the supporting device is a curved structure. In each of the buffering modules, when the hinge module is bent from the unfolded position to the outwardly folded position, the guiding portion is moved by the corresponding spiral track to cause that the rack gear rotates the gearing portion of the transmitting member, and the fixing portion of the transmitting member drives the external connecting member to slide relative to the internal connecting member toward the row of the pivots. The carrying plate is fixed on the external connecting members of the two supporting devices. The bendable display is mounted on the carrying plate. When each of the two buffering modules is rotated to the outwardly folded position, the two supporting devices are arranged inside of the bendable display.

The present disclosure also discloses a supporting device including a hinge module and two buffering modules. The hinge module includes a plurality of pivots and a plurality of torsion units. The pivots are parallel to each other and are arranged in a row. Two spiral tracks are respectively recessed on two opposite portions of the pivots. The torsion units are sleeved on the pivots. Two positioning portions are respectively arranged on two opposite portions of the torsion units. The two buffering modules are respectively arranged at two opposite sides of the row of the pivots and respectively fixed on the two positioning portions. The two buffering modules are respectively corresponding in position to the two spiral tracks. Each of the two buffering modules includes an internal connecting member, an external connecting member, a transmitting shaft, and a driving member. The internal connecting member is fixed on the corresponding positioning portion. The external connecting member is slidably disposed on the internal connecting member. The transmitting shaft has a gearing portion and a fixing portion. The gearing portion is pivotally connected to the internal connecting member, and the fixing portion is connected to the external connecting member. The driving member has a rack gear and a guiding portion. The rack gear is engaged with the gearing portion, and the guiding portion is arranged in the corresponding spiral track. The hinge module is bendable between an unfolded position and an outwardly folded position along at least one of the pivots. When the hinge module is at the unfolded position, the supporting device is a flat structure. When the hinge module is at the outwardly folded position, the supporting device is a curved structure. In each of the buffering modules, when the hinge module is bent from the unfolded position to the outwardly folded position, the guiding portion is moved by the corresponding spiral track to cause that the rack gear rotates the gearing portion of the transmitting member, and the fixing portion of the transmitting member drives the external connecting member to slide relative to the internal connecting member toward the row of the pivots.

In summary, when the hinge modules of the bendable display apparatus are bent, the hinge modules do not stretch the bendable display (or the carrying plate) by moving the external connecting members relative to the internal connecting members. Thus, when the two supporting devices support the bendable display, the bendable display can be bent without suffering damage.

In order to further appreciate the characteristics and technical contents of the present disclosure, references are hereunder made to the detailed descriptions and appended drawings in connection with the present disclosure. However, the appended drawings are merely shown for exemplary purposes, and should not be construed as restricting the scope of the present disclosure.

DETAILED DESCRIPTION OF THE PREFERRED EMBODIMENTS

Reference is made to FIGS. 1 to 16, which illustrate the present disclosure. References are hereunder made to the detailed descriptions and appended drawings in connection with the present disclosure. However, the appended drawings are merely provided for exemplary purposes, and should not be construed as restricting the scope of the present disclosure.

First Embodiment

Figure 1:
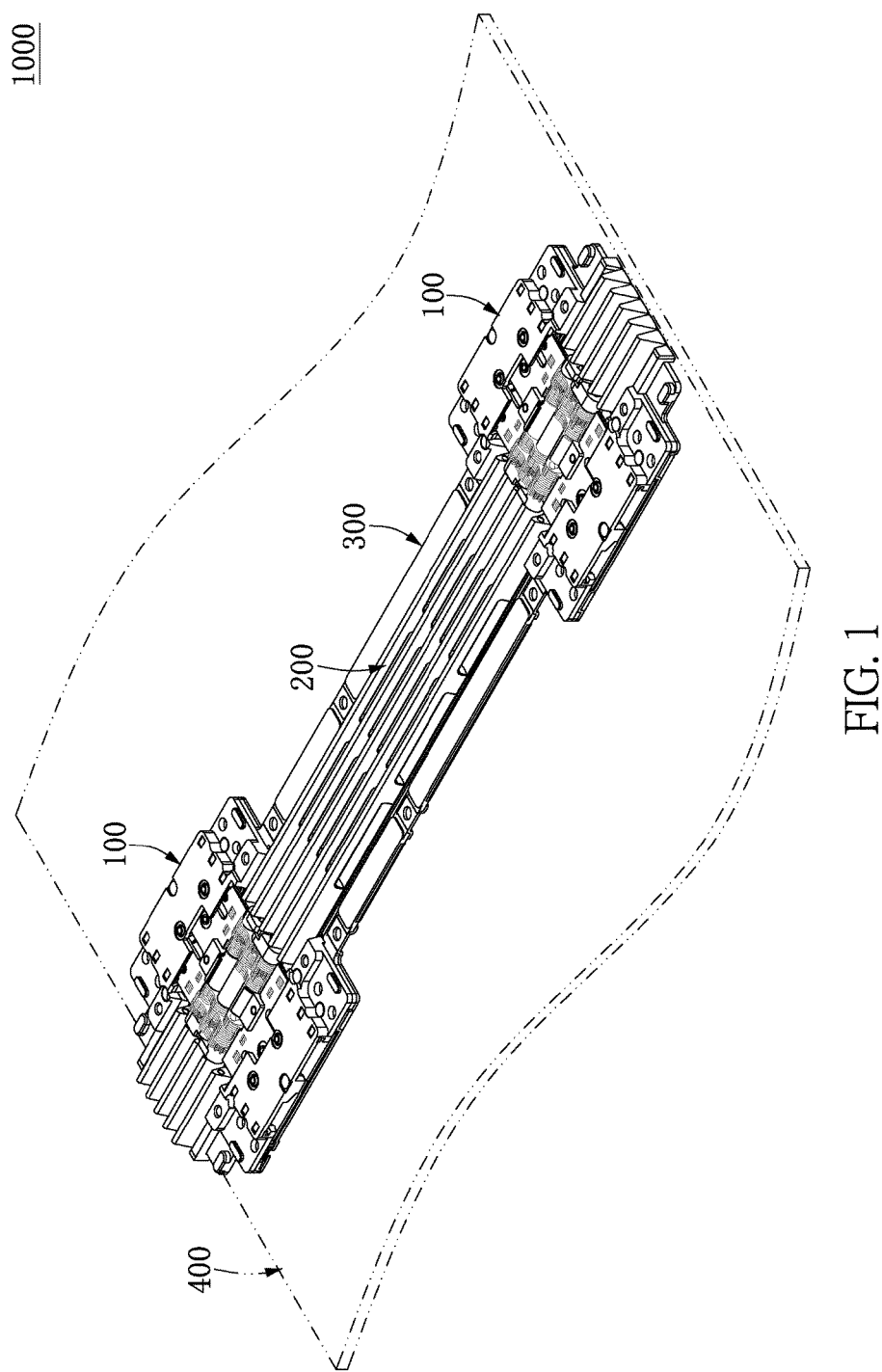
FIG. 1 is a perspective view showing a bendable display apparatus according to a first embodiment of the present disclosure.
Figure 2:
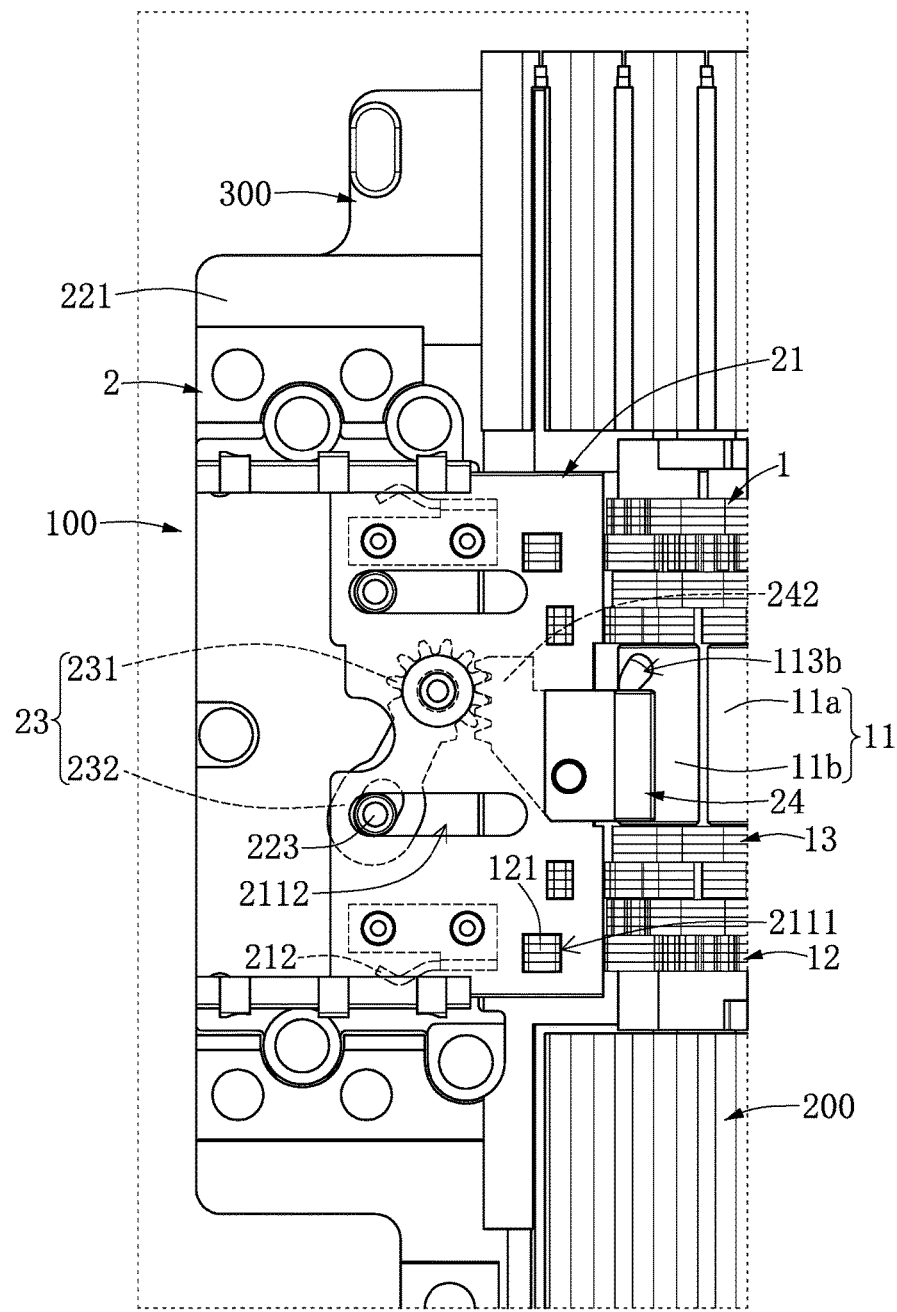
FIG. 2 is an enlarged view of FIG. 1 with a first cover omitted.
Figure 3:
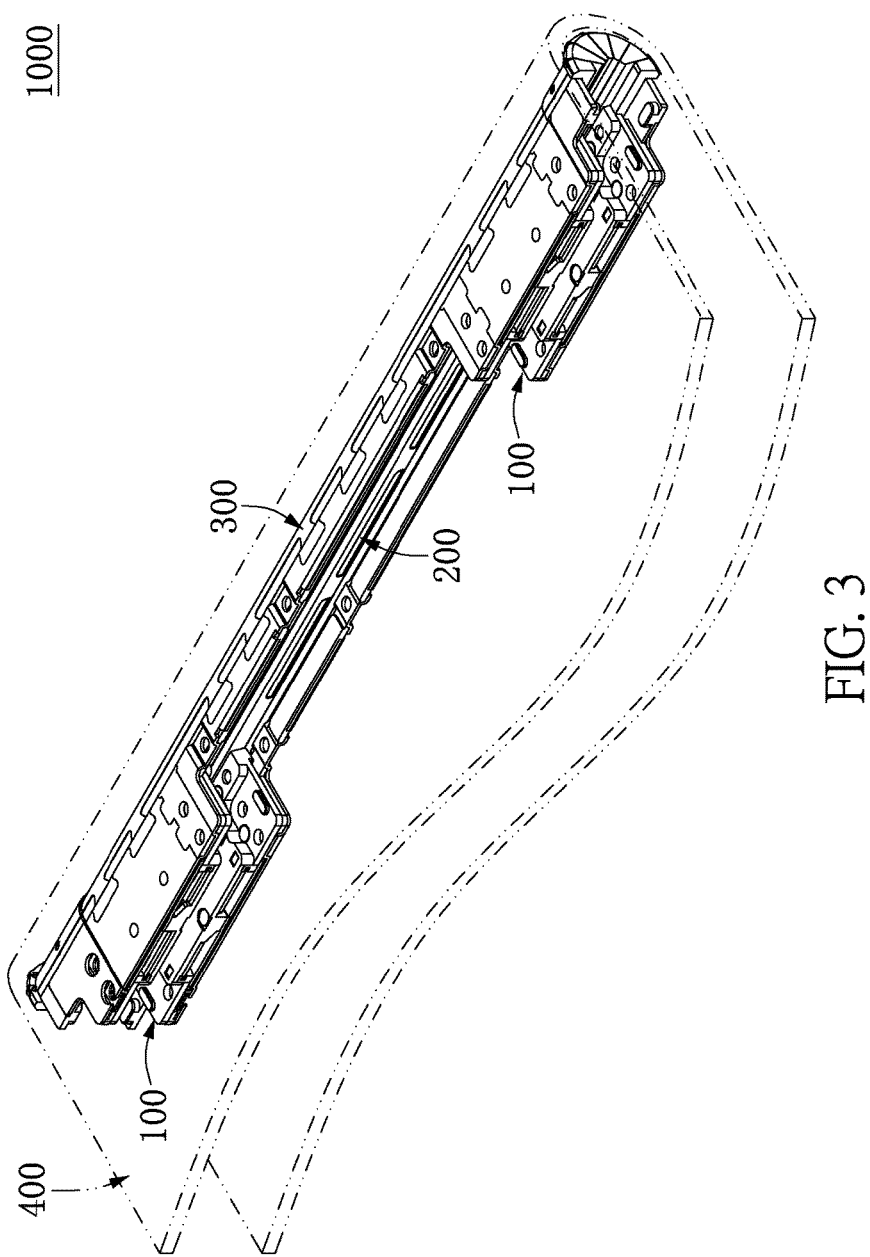
FIG. 3 is a perspective view showing the bendable display apparatus being bent outwardly at 180 degrees.

Reference is first made to FIGS. 1 to 9, which illustrates a bendable display apparatus 1000 according to a first embodiment of the present disclosure. As shown in FIGS. 1 to 6, the bendable display apparatus 1000 includes two supporting devices 100, a plurality of connecting tubes 200 connecting the two supporting devices 100, a carrying plate 300, and a bendable display 400. The two supporting devices 100 and the connecting tubes 200 are disposed on one side of the carrying plate 300 (i.e., the top side shown in FIG. 1), and the bendable display 400 is disposed on the other side of the carrying plate 300 (i.e., the bottom side shown in FIG. 1). A portion of the bendable display 400 corresponding in position to the supporting devices 100 and the connecting tubes 200 can be outwardly bent at 180 degrees (as shown in FIG. 3) without suffering damage, but the present disclosure is not limited thereto.

It should be noted that the movement of the bendable display apparatus 1000 is a relative motion, so that the figures are fixed part of the components for clearly showing the present embodiment. Moreover, the supporting device 100 in the present embodiment is applied to the bendable display apparatus 1000, but the supporting device 100 can be applied to other apparatus.

The following description discloses the structure of each of the components of the bendable display apparatus 1000, and then discloses the related features of the components of the bendable display apparatus 1000. The two supporting devices 100 in the present embodiment are substantially the identical or symmetrical structures, so the following description discloses just one of the two supporting devices 100 for the sake of brevity.

Figure 7:
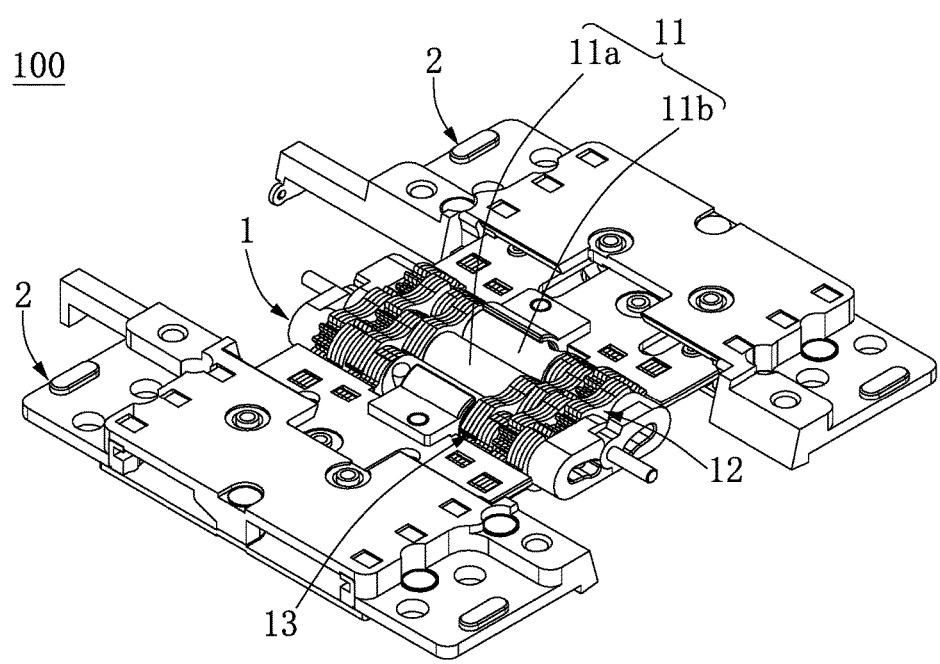
FIG. 7 is a perspective view showing a supporting device of FIG. 5.
Figure 8:
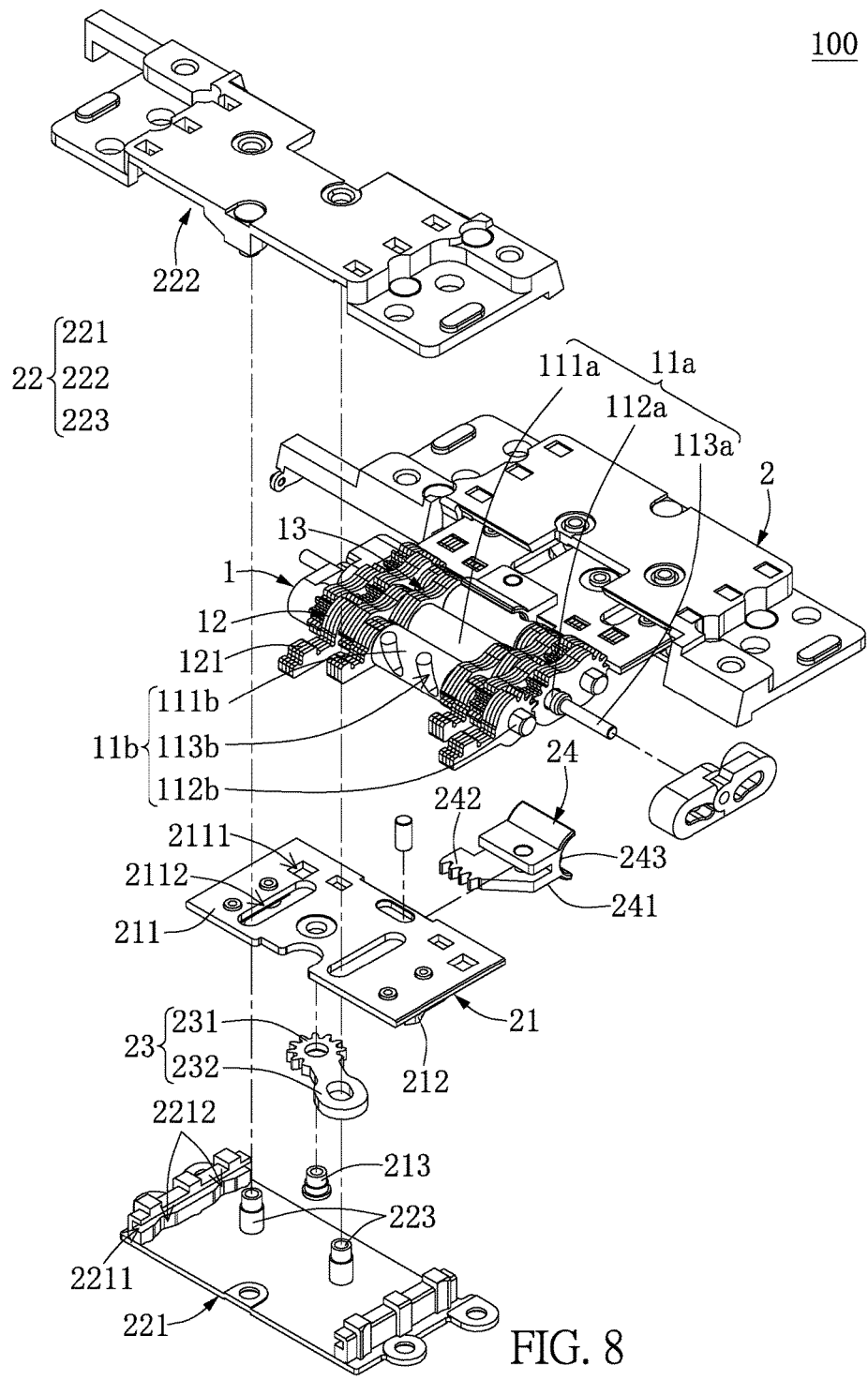
FIG. 8 is an exploded view of FIG. 7.
Figure 9:
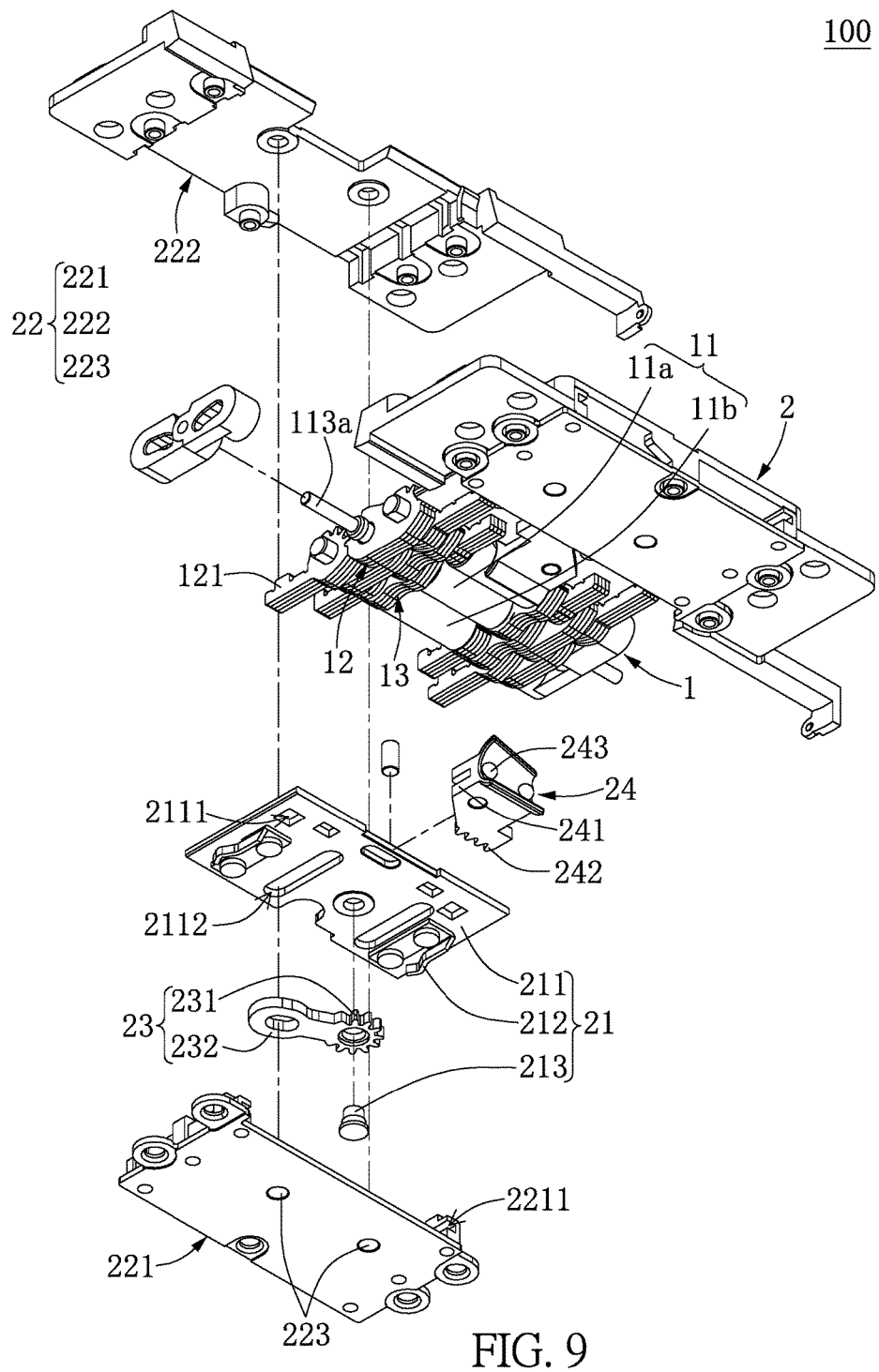
FIG. 9 is an exploded view of FIG. 7 from another perspective.

As shown in FIGS. 7 to 9, the supporting device 100 includes a hinge module 1 and two buffering modules 2 respectively installed on two opposite sides of the hinge module 1 (i.e., the left side and the right side of the hinge module 1 as shown in FIG. 7). The hinge module 1 includes a plurality of pivots 11 parallel to each other and arranged in a row, a plurality of torsion units 12 sleeved on the pivots 11, and a plurality of linking units 13. The pivots 11 of the hinge module 1 in the present embodiment are three straight rods, but the present disclosure is not limited thereto.

Moreover, the pivots 11 of the hinge module 1 include a central pivot 11a and two outer pivots 11b respectively arranged at two opposite sides of the central pivot 11a. The central pivot 11a has a first segment 111a, two second segments 112a respectively extending from two opposite ends of the first segment 111a, and two third segments 113a respectively extending from two ends of the two second segments 112a. An outside diameter of the first segment 111a is larger than that of each of the two second segments 112a, and the outside diameter of each of the two second segments 112a is larger than that of each of the two third segments 113a.

Each of the two outer pivots 11b has a first segment 111b and two second segments 112b respectively extending from two opposite ends of the first segment 111b, and an outside diameter of the first segment 111a is larger than that of each of the two second segments 112a. The first segment 111b of each of the outer pivots 11b has at least one spiral track 113b recessed thereon, and the spiral tracks 113b of the two outer pivots 11b are respectively arranged on two opposite portions of the two first segments 111b. That is to say, the two spiral tracks 113b are respectively recessed on two opposite portions of the pivots 11.

The torsion unit 12 can be at least one of a gear, a plurality of stacked gear-plates, and a plurality of stacked washers. The torsion unit 12 can be sleeved on the second segment 112a, 112b of one of the pivots 11 or the second segments 112a, 112b of two of the pivots 11. In the present embodiment, the torsion units 12 are arranged in a plurality of rows, and any two adjacent torsion units 12 arranged in the same row are engaged with each other. Moreover, any two adjacent rows of the torsion units 12 respectively have two elongated positioning portions 121 arranged on two of the torsion units 12 thereof. Specifically, the two positioning portions 121 of the any two adjacent rows of the torsion units 12 are arranged away from each other, and the two positioning portions 121 are arranged at two opposite sides of the any two adjacent rows of the pivots 11.

In the present embodiment, the torsion unit 12 having the positioning portion 121 is sleeved on one of the pivots 11. Specifically, the torsion units 12 of the present embodiment have four positioning portions 121 for respectively connecting the two buffering modules 2, but the present disclosure is not limited thereto. Moreover, in one of any two adjacent rows of the torsion units 12, the torsion unit 12 provided without any positioning portion 121 is sleeved on two adjacent pivots 11, in which the two adjacent pivots 11 are respectively inserted into two engaged torsion units 12 of the other row.

The linking unit 13 can be at least one of a sheet and a plurality of stacked sheets. The linking unit 13 can be sleeved on the second segment 112a, 112b of one of the pivots 11 or the second segments 112a, 112b of two of the pivots 11 respectively inserted into different torsion units 12.

Figure 4:
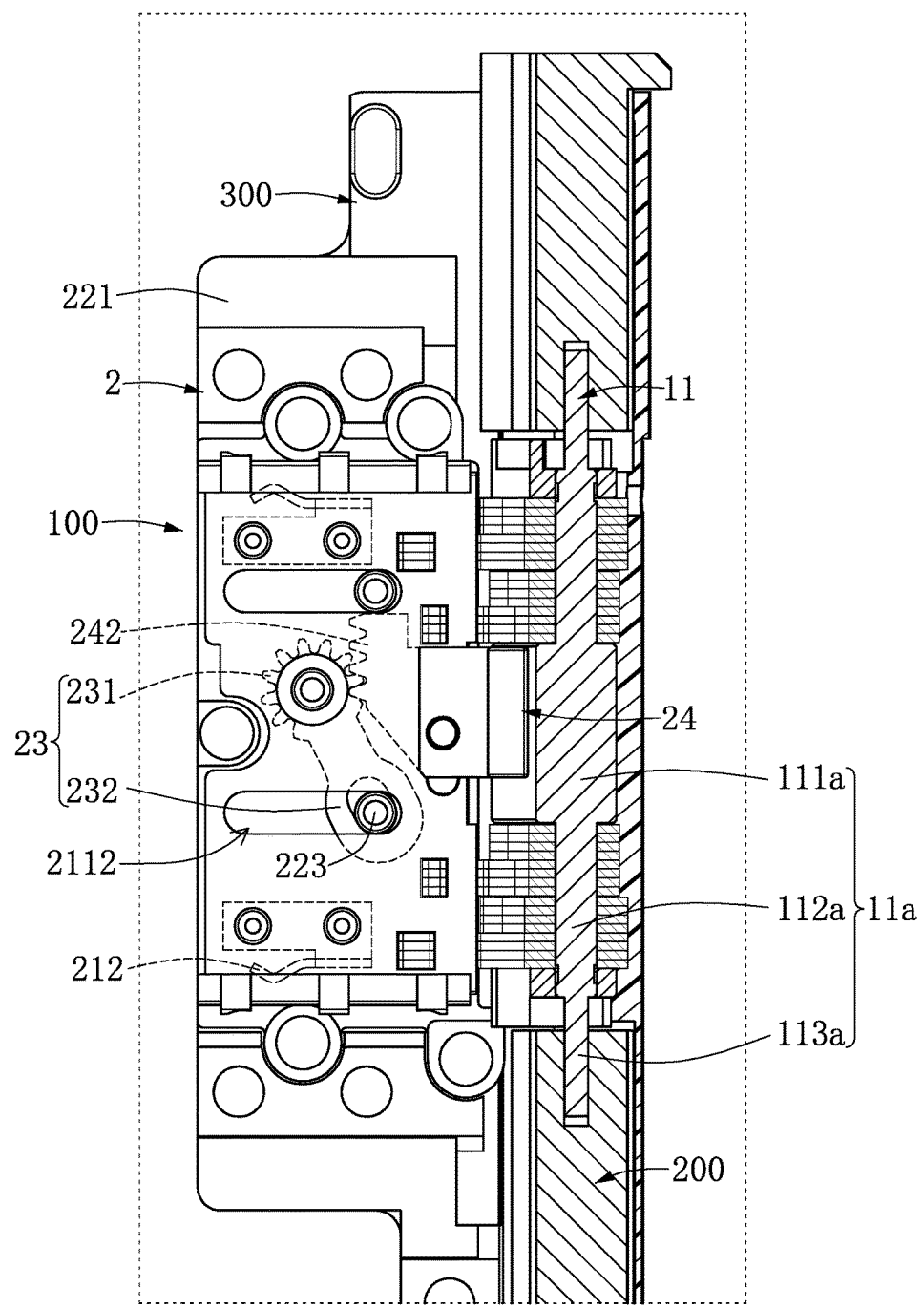
FIG. 4 is an enlarged view of FIG. 3 with the first cover omitted.

Thus, the hinge module 1 is bendable between an unfolded position (as shown in FIGS. 1 and 2) and an outwardly folded position (as shown in FIGS. 3 and 4) along at least one of the pivots 11, and the torsion units 12 and the linking units 13 are configured to stop the hinge module 1 at a desired position between the unfolded position and the outwardly folded position. When the hinge module 1 is at the unfolded position, the supporting device 100 is a flat structure. When the hinge module 1 is at the outwardly folded position, the supporting device 100 is a curved structure and is approximately arranged at the inner side of the bendable display 400. Specifically, as shown in FIGS. 3 and 4, the outwardly folded position in the present embodiment is defined by outwardly bending the hinge module 1 from the unfolded position at 180 degrees, but the present disclosure is not limited thereto.

As shown in FIGS. 7 to 9, the two buffering modules 2 are respectively arranged at two opposite sides of the pivots 11, and the two buffering modules 2 are respectively fixed on the positioning portions 121 of the torsion units 12. The two buffering modules 2 in the present embodiment are substantially the identical or symmetrical structures, so the following description only illustrates one of the two buffering modules 2 for the sake of brevity.

As shown in FIGS. 8 and 9, the buffering module 2 includes an internal connecting member 21 fixed on the corresponding positioning portions 121, an external connecting member 22 slidably disposed on the internal connecting member 21, a transmitting shaft 23, and a driving member 24. The internal connecting member 21 includes a plate 211, two elastic sheets 212 fixed on the plate 211, and a fixing pin 213 perpendicularly fixed on the plate 211 and arranged between the two elastic sheets 212. The plate 211 has a plurality of wedging holes 2111 and two elongated track holes 2112, and the wedging holes 2111 of the plate 211 are sleeved on the corresponding positioning portions 121. The two track holes 2112 are arranged at two opposite sides of the fixing pin 213 and are arranged between the two elastic sheets 212. The two track holes 2112 in the present embodiment are parallel to each other and perpendicular to each of the pivots 11.

The external connecting member 22 includes a first cover 221, a second cover 222, and two guiding pins 223. The first cover 221 and the second cover 222 are assembled with each other to accommodate a part of the plate 211 and a part of each of the elastic sheets 212. The first cover 221 has two elongated sliding grooves 2211 formed on an inner side thereof, and the two sliding grooves 2211 face each other to respectively accommodate two opposite edges of the plate 211. The first cover 221 has four concavities 2212 respectively arranged close to the two sliding grooves 2211, and each of the elastic sheets 212 is selectively wedged to one of the two concavities 2212 arranged close to the corresponding sliding groove 2211. Two opposite ends of each of the two guiding pins 223 are respectively and perpendicularly fixed on the first cover 221 and the second cover 222, and the two guiding pins 223 are respectively inserted into the two track holes 2112 of the plate 211.

The transmitting shaft 23 is arranged between the plate 211 of the internal connecting member 21 and the first cover 221 of the external connecting member 22, and the transmitting shaft 23 has a gearing portion 231 and a fixing portion 232 arranged on two opposite portions thereof. The gearing portion 231 is pivotally connected to the plate 211 of the internal connecting member 21 by the fixing pint 213. The fixing portion 232 is sleeved on one of the two guiding pins 223.

The driving member 24 in the present embodiment is integrally formed as one piece, but the present disclosure is not limited thereto. The driving member 24 includes a U-shaped plate 241, a rack gear 242, and a guiding portion 243. The rack gear 242 and the guiding portion 243 are respectively connected to two opposite sides of the U-shaped plate 241. A portion of the internal connecting member 21 arranged adjacent to the pivots 11 is inserted into a notch of the U-shaped plate 241. The rack gear 242 is arranged between the plate 211 of the internal connecting member 21 and the first cover 221 of the external connecting member 22, and is engaged with the gearing portion 231 of the transmitting shaft 23. The guiding portion 243 is arranged in the corresponding spiral track 113b. The guiding portion 243 in the present embodiment includes two protrusions respectively arranged in the two spiral tracks 113b of the corresponding pivot 111, but the present disclosure is not limited thereto. For example, the guiding portion 243 can be a protrusion, and the first segment 111b of the corresponding outer pivot 11b has only one spiral track 113b for accommodating the protrusion.

Thus, as shown in FIGS. 2, 4, 8, and 9, when the hinge module 1 is bent from the unfolded position (as shown in FIGS. 1 and 2) to the outwardly folded position (as shown in FIGS. 3 and 4), the guiding portion 243 of the driving member 24 of each of the buffering modules 2 is moved by the corresponding spiral track 113b to cause that the rack gear 242 moves in straight relative to the internal connecting member 21 to rotate the gearing portion 231 of the transmitting member 23, so that the fixing portion 232 of the transmitting member 23 drives the external connecting member 22 to slide relative to the internal connecting member 21 toward the row of the pivots 11 (i.e., the sliding grooves 2211 of the first cover 221 slide along the edges of the plate 211). A sliding distance of the external connecting member 22 relative to the internal connecting member 21 is preferably proportional to a bending angle of the hinge module 1, but the present disclosure is not limited thereto.

As shown in FIG. 2, when the supporting device 1 is bent from the outwardly folded position to the unfolded position, each of the elastic sheets 212 of the internal connecting member 21 is wedged in the corresponding concavity 2212 arranged adjacent to the pivots 11, and each of the guiding pins 223 is arranged at one of two opposite ends of the corresponding track hole 2112 (i.e., the left end of the track hole 2112 shown in FIG. 2), so that each of the external connecting members 22 cannot further move away from the outwardly folded position (i.e., the supporting device 1 cannot be inwardly bent), and thus the hinge module 1 can be maintained at the unfolded position.

Moreover, as shown in FIG. 4, when the supporting device 1 is bent from the unfolded position to the outwardly folded position, each of the elastic sheets 212 of the internal connecting member 21 is wedged in the corresponding concavity 2212 arranged away from the pivots 11, and each of the guiding pins 223 is arranged at the other end of the corresponding track hole 2112 (i.e., the right end of the track hole 2112 shown in FIG. 4), so that each of the external connecting member 22 cannot further move away from the unfolded position (i.e., the supporting device 1 cannot be further bent), and thus the hinge module 1 can be maintained at the outwardly folded position.

Figure 5:
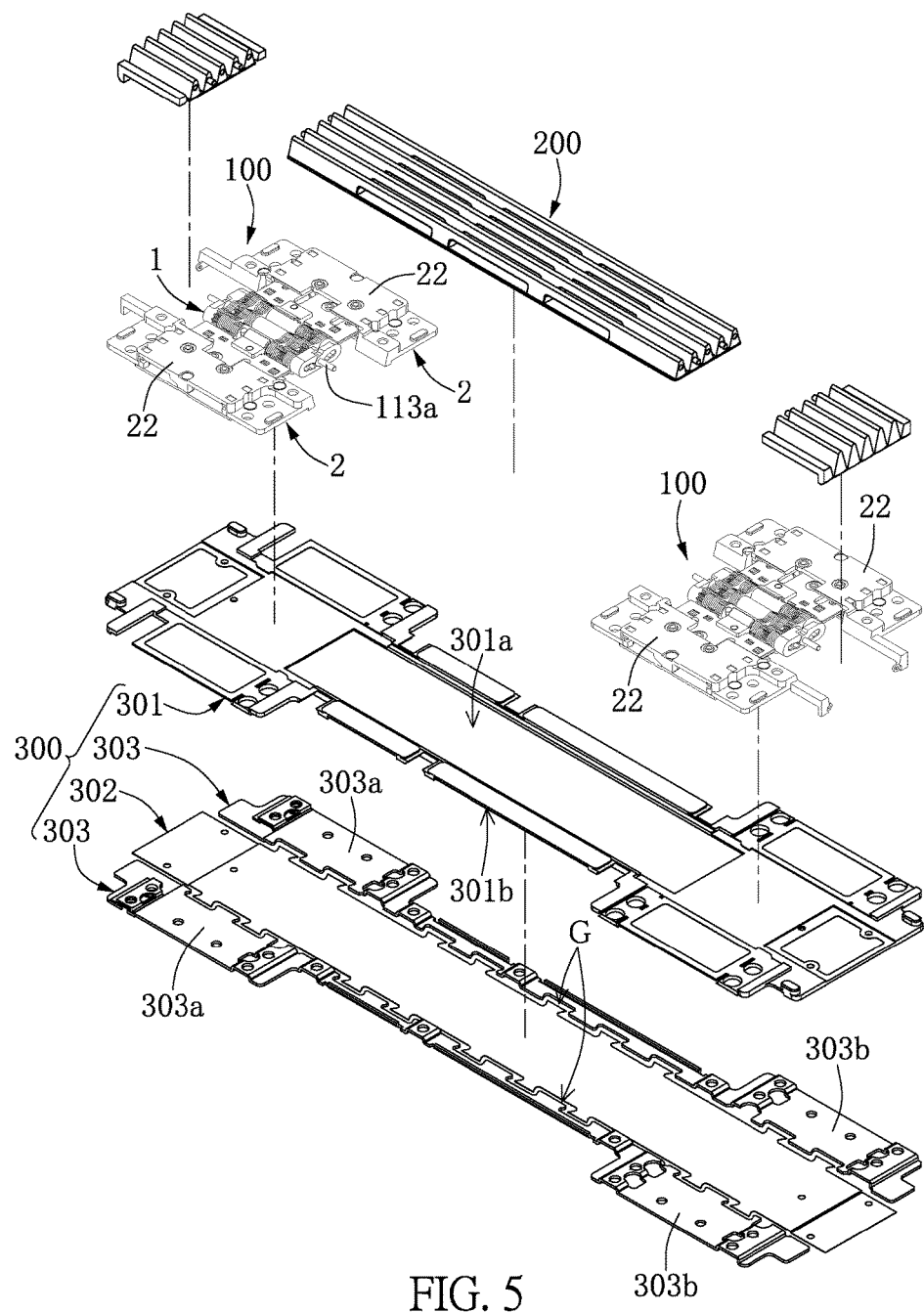
FIG. 5 is an exploded view of FIG. 1 with a bendable display omitted.
Figure 6:
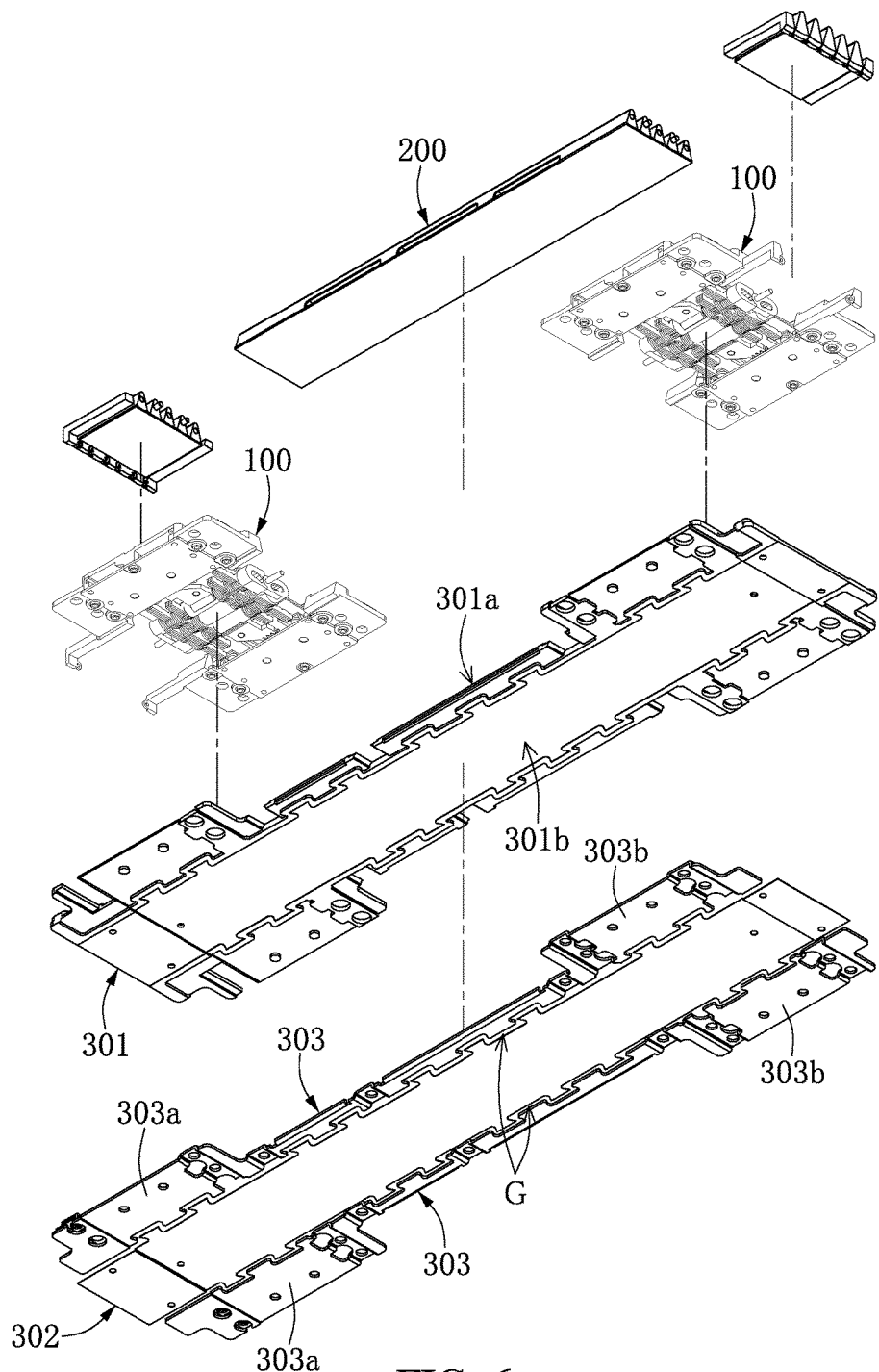
FIG. 6 is an exploded view of FIG. 1 from another perspective with a bendable display omitted.

The supporting device 100 in the present embodiment has been disclosed in the above description, and the following description discloses the other components of the bendable display apparatus 1000. As shown in FIGS. 5 and 6, the connecting tubes 200 are disposed on the carrying plate 300. An end of the connecting tubes 200 (i.e., the left end as shown in FIG. 5) is connected to one of the two supporting devices 100, and the other end of the connecting tubes 200 (i.e., the right end as shown in FIG. 5) is connected to the other supporting device 100. Thus, the two supporting devices 100 can be smoothly operated at the same time by using the connecting tubes 200.

The carrying plate 300 is fixed on the external connecting members 22 of the two supporting devices 100 and entirely covers one side of the two supporting devices 100 and the connecting tubes 200. The carrying plate 300 includes a cushion sheet 301 (i.e., a rubber sheet), a central metal sheet 302, and two side metal sheets 303. The central metal sheet 302 can include a plurality of metal sheets, but the present disclosure is not limited thereto. In addition, the bendable display 400 is mounted on the cushion sheet 301, the central metal sheet 302, and the two side metal sheets 303 of the carrying plate 300.

Specifically, the cushion sheet 301 has a first side 301a and an opposite second side 301b. The two supporting devices 100 and the connecting tubes 200 are disposed on the first side 301a of the cushion sheet 301. The central metal sheet 302 and the two side metal sheets 303 are fixed on the second side 301b of the cushion sheet 300, and the two side metal sheets 303 are respectively arranged at two opposite sides of the central metal sheet 302.

Each of the two side metal sheets 303 has a first end portion 303a and an opposite second end portion 303b. The first end portions 303a of the two side metal sheets 303 are configured to respectively correspond in position to the external connecting members 22 of the two buffering modules 2 of one of the two supporting device 100, and the second end portions 303b of the two side metal sheets 303 are configured to respectively correspond in position to the external connecting members 22 of the two buffering modules 2 of the other supporting device 100.

Moreover, the central metal sheet 302 and each of the two side metal sheets 303 have a gap G there-between, and the gaps G are fully filled with the cushion sheet 301. A portion of the cushion sheet 301 in the gaps G is coplanar with the two side metal sheets 303 and the central metal sheet 302. Thus, when the hinge module 1 is at the outwardly folded position, the central metal sheet 302 is bent and generates a slight deformation, and the carrying plate 300 can absorb the slight deformation by the cushion sheet 301.

In summary, when the hinge modules 1 of the bendable display apparatus 1000 are bent between the unfolded position and the outwardly folded position, the hinge modules 1 do not stretch the bendable display 400 (or the carrying plate 300) by moving the external connecting members 22 relative to the internal connecting members 21. Thus, when the two supporting devices 100 support the bendable display 400, the bendable display 400 can be bent without suffering damage.

Second Embodiment

Figure 10:
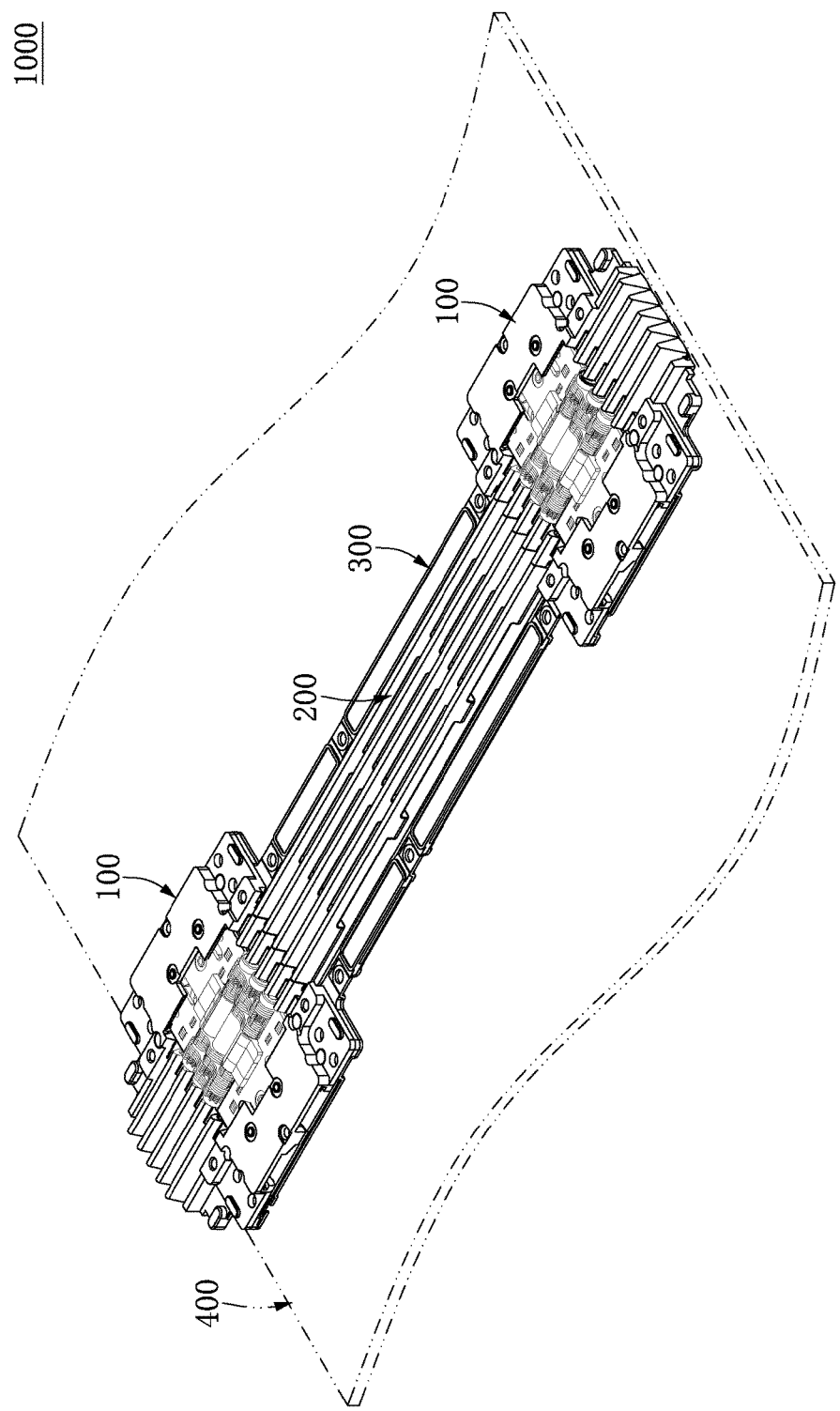
FIG. 10 is a perspective view showing a bendable display apparatus according to a second embodiment of the present disclosure.
Figure 11:
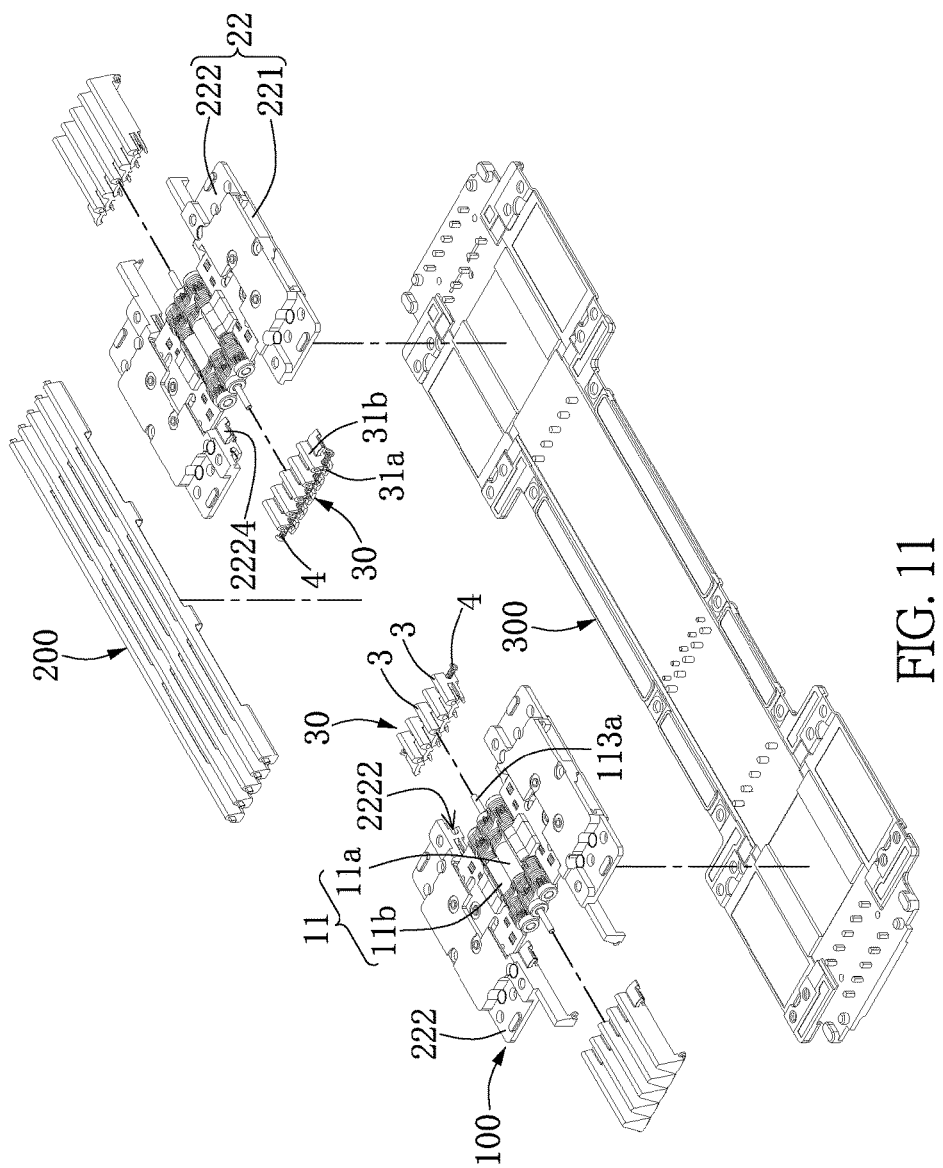
FIG. 11 is an exploded view of FIG. 10 with a bendable display omitted.

Reference is made to FIGS. 10 to 16 which illustrate a second embodiment of the present disclosure. The present embodiment is similar to the first embodiment. The difference between the present embodiment and the first embodiment is disclosed as follows. Each of the two supporting devices 100 in the present embodiment includes at least one modular joint assembly 30 installed on the two buffering modules 2 thereof and two springs 4 (as shown in FIGS. 10 and 11) installed in the modular joint assembly 30. Moreover, the two supporting devices 100 in the present embodiment are substantially the identical or symmetrical structures, so the following description discloses just one of the two supporting devices 100 for the sake of brevity.

As shown in FIG. 11, the modular joint assembly 30 includes a plurality of joints 3 detachably buckled in sequence, and the corresponding spring 4 is wedged in the joints 3. In each of the two supporting devices 100, two opposite ends of the joints 3 are respectively installed on the two external connecting members 22, at least one of the joints 3 is fixed on at least one of the pivots 11 (i.e., the third segment 113a of the central pivot 11a), and two opposite ends of the spring 4 are respectively fixed on the second cover 222 of the two external connecting members 22. Thus, when the joints 3 are moved, the spring 4 can provide an elastic force intending to maintain the joints 3 being a straight structure.

As the joints 3 in the present embodiment are of the same structure, the following description discloses the structure of just one of the joints 1 for the sake of brevity. However, in other embodiments of the present invention, the joints 3 may be formed of different structures.

Figure 12:
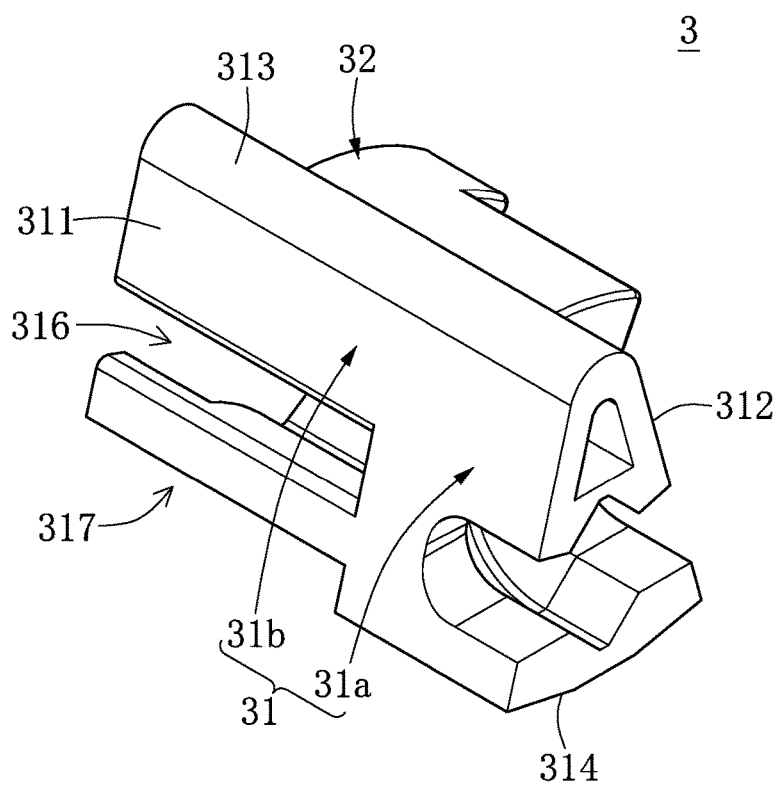
FIG. 12 is a perspective view showing a joint of FIG. 11.
Figure 13:
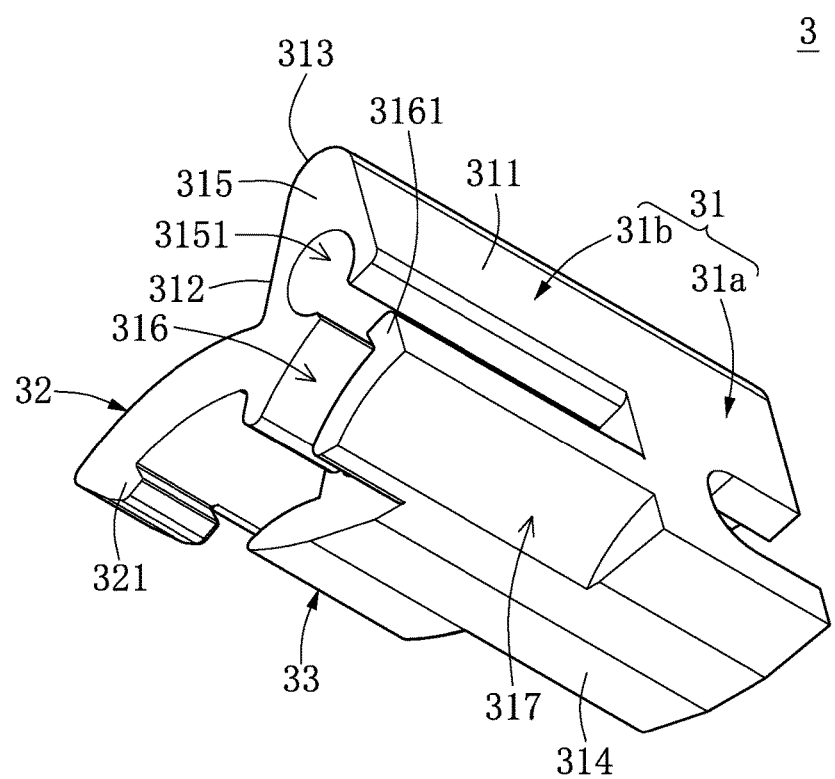
FIG. 13 is a perspective view showing a joint of FIG. 11 from another perspective.
Figure 14:
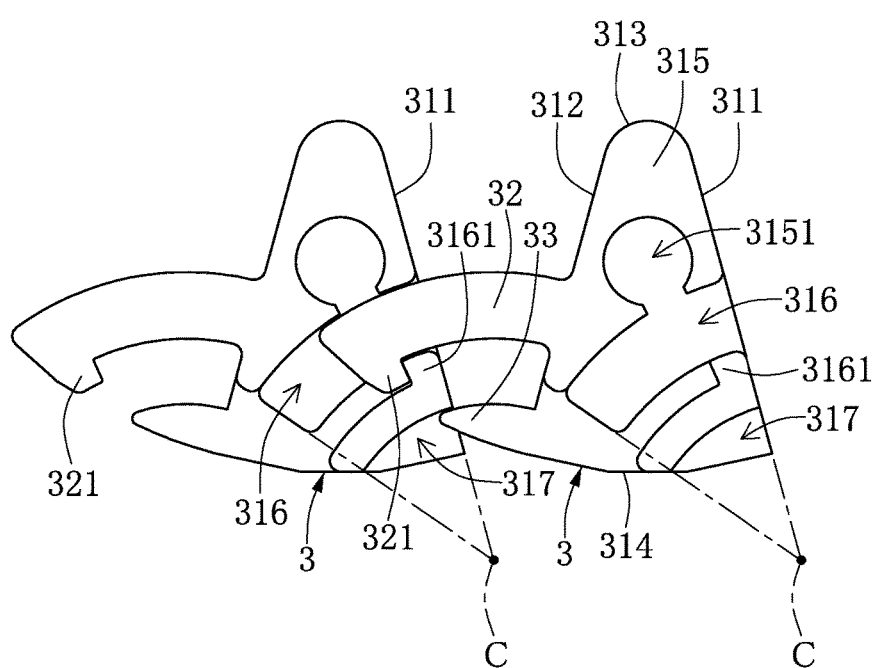
FIG. 14 is a planar view showing any two of the joints engaged with each other of FIG. 11.

As shown in FIGS. 12 to 14, the joint 3 is an integral structure and includes a main portion 31, a buckling portion 32, and a guiding protrusion 33. The main portion 31 is approximately a triangular column and includes a first mating surface 311 (i.e., the right surface of the main portion 31 shown in FIG. 13), an opposite second mating surface 312 (i.e., the left surface of the main portion 31 shown in FIG. 13), an inner surface 313 (i.e., the arced top surface of the main portion 31 shown in FIG. 13) connected to an edge of the first mating surface 311 and an edge of the second mating surface 312, and an outer surface 314 (i.e., the bottom surface of the main portion 31 shown in FIG. 13) connected to the other edge of the first mating surface 311 and the other edge of the second mating surface 312.

Moreover, a distance between the first mating surface 311 and the second mating surface 312 is gradually increased in a direction from the inner surface 313 to the outer surface 314 (i.e., from top to bottom, as shown in FIG. 13). The first mating surface 311 and the second mating surface 312 in the present embodiment are planar surfaces.

Specifically, the main portion 31 has a stopping block 31a and an actuation block 31b, and the spring 4 is wedged in the stopping block 31a. In this embodiment, most of the features of the joint 3 are formed on the actuation block 31b, but the present disclosure is not limited thereto. The main portion 31 (or the actuation block 31b) has an arced track groove 316 recessed on the first mating surface 311, and a center of circle C of the track groove 316 is located at one side of the outer surface 314 away from the second mating surface 312 (i.e., the lower right side of the outer surface 314 shown in FIG. 14). The track groove 316 is also exposed from an end surface 315 of the actuation block 31b arranged away from the stopping block 31a (as shown in FIG. 13). That is to say, a bottom of the track groove 316 is arranged on the stopping block 31a. The main portion 31 (or the actuation block 31b) further has a stopping ridge 3161 arranged in the track groove 316 and is adjacent to the first mating surface 311, thereby reducing an opening of the track groove 316 arranged on the first mating surface 311.

Moreover, the main portion 31 (or the actuation block 31b) has a guiding concavity 317 recessed on a common border between the first mating surface 311 and the outer surface 314. The guiding concavity 317 is preferably formed by an arc surface, and a center of circle of the guiding concavity 317 overlaps the center of circle C of the track groove 316. The guiding concavity 317 is also exposed from the end surface 315 of the actuation block 31b arranged away from the stopping block 31a. In addition, the main portion 31 further has an inserting hole 3151 recessed on the end surface 315 of the actuation block 31b, so that the inserting hole 3151 of the central joint 3 of the modular joint assembly 30 can be used to accommodate the third segment 113a of the central pivot 11a.

The buckling portion 32 has an arced shape and extends from the second mating surface 312 (of the actuation block 31b) of the main portion 31, and the buckling portion 32 corresponds in shape with the track groove 316 to move therein. The buckling portion 32 has a hook 321 arranged on a free end thereof, and a width of the free end of the buckling portion 32 is larger than that of the opening of the track groove 316. Moreover, the guiding protrusion 33 extends from a common border between the second mating surface 312 and the outer surface 314. A surface of the guiding protrusion 33 facing the buckling portion 32 (i.e., the top surface of the guiding protrusion 33 shown in FIG. 14) is in an arc shape and has a center of circle, which is located at a center of circle of the buckling portion 32.

Figure 15:
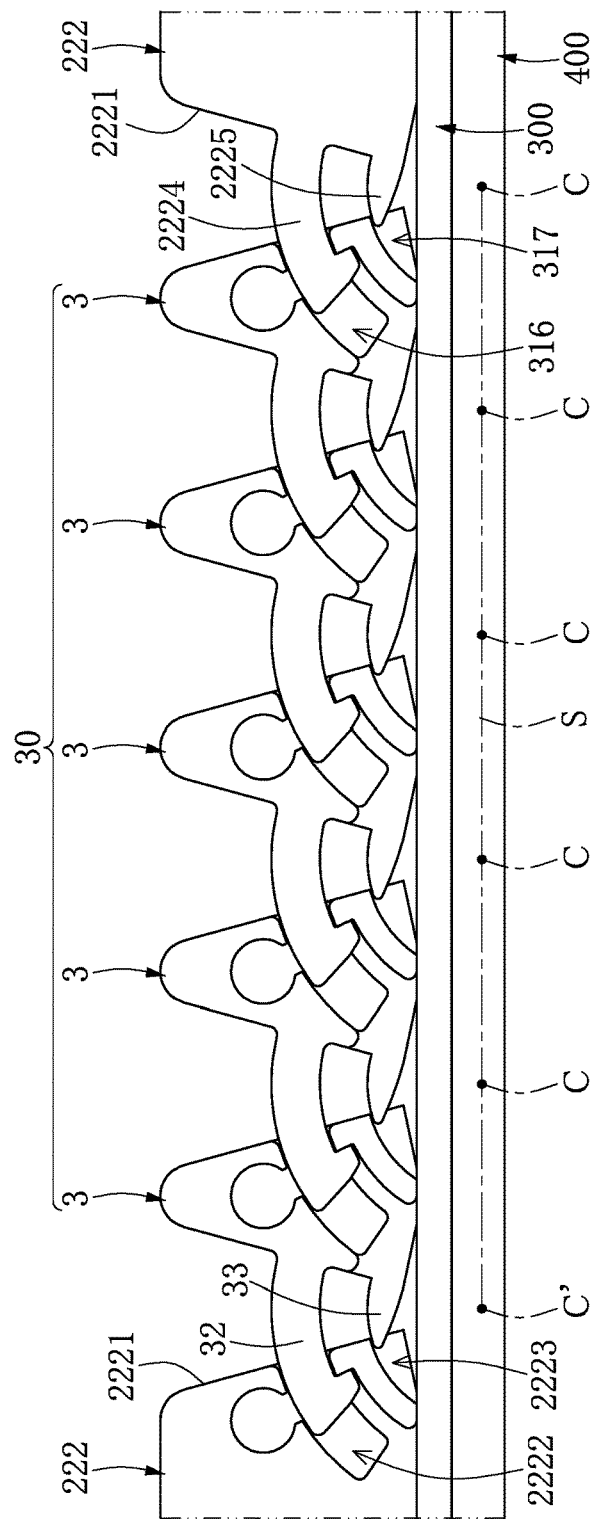
FIG. 15 is a planar view showing a modular joint assembly applied to the bendable display.
Figure 16:
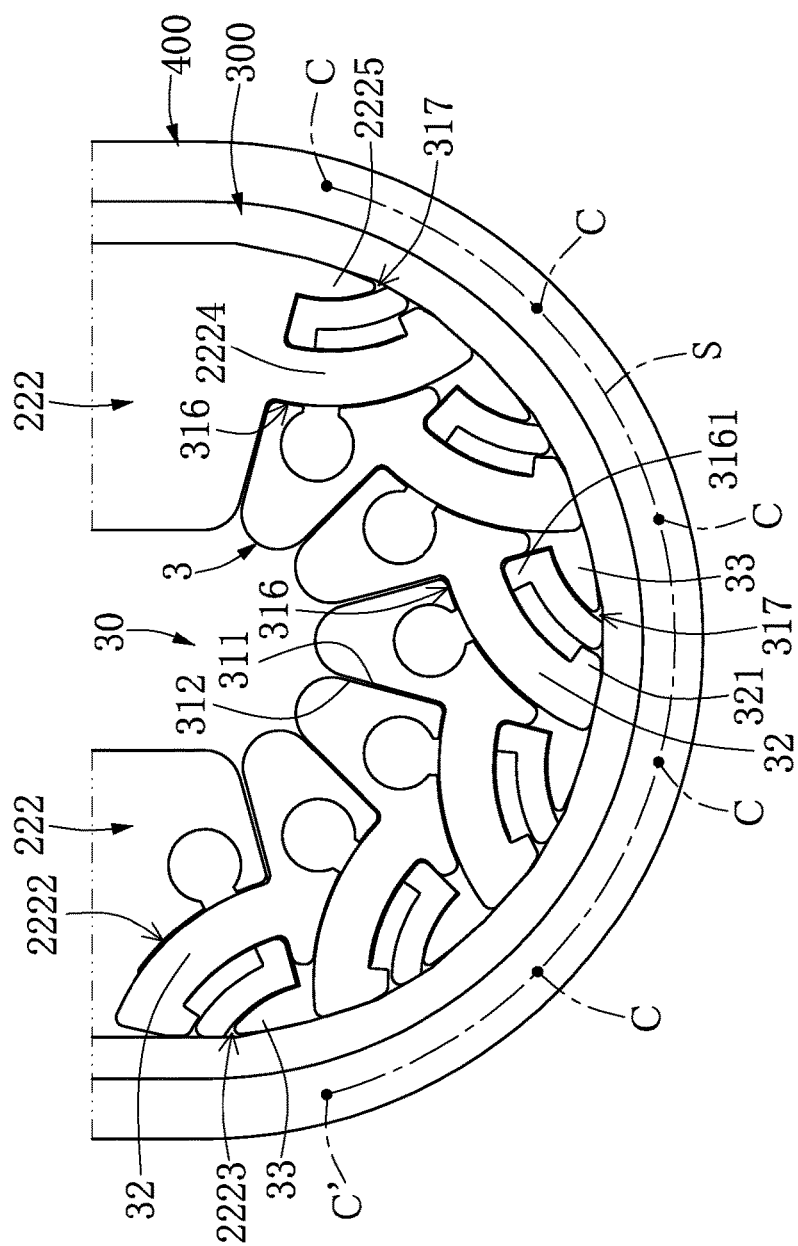
FIG. 16 is a planar view showing the modular joint assembly being bent outwardly at 180 degrees.

The structure of the joint 3 has been disclosed in the above description; the following description will disclose the connection relationship of the buckled joints 3. As shown in FIGS. 14 to 16, in any of the two buckled joints 3, the buckling portion 32 and the guiding protrusion 33 of one of the any two buckled joints 3 are respectively arranged in the track groove 316 and the guiding concavity 317 of the other joint 3, and the any two buckled joints 3 are rotatable relative to each other.

As shown in FIG. 14, in any two buckled joints 3, the center of circle of the buckling portion 32 of one of the any two buckled joints 3 overlaps the center of circle C of the corresponding track groove 316 of the other joint 3, and the any two buckled joints 3 are rotatable along the center of circle C. That is to say, the center of circle C of the track groove 316 can be regarded as a rotating axis. For any two buckled joints 3, an imaginary connecting line can be defined by connecting the centers C of the any two buckled joints 3. In other words, for the modular joint assembly 30, an imaginary datum line S (as shown in FIGS. 15 and 16) can be defined by connecting the centers C of the modular joint assembly 30. The imaginary datum line S is located at one side of the carrying plate 300 away from the modular joint assembly 30, and the length of the imaginary datum line S is always unchanged when any two buckled joints 3 are rotated relative to each other.

In any two buckled joints 3, the guiding protrusion 33 of one of the any two buckled joints 3 is movable and abutted against the guiding concavity 317 of the other joint 3, and the related movement of the any two buckled joints 3 is more smoothly by using the cooperation of the guiding protrusion 33 and the guiding concavity 317.

Specifically, as shown in FIGS. 14 and 15, when the hinge module 1 is at the unfolded position, in any two buckled joints 3, the buckling portion 32 is partially arranged in the corresponding track groove 316, the hook 321 is abutted against the stopping ridge 3161, an end portion of the top surface of the guiding protrusion 33 contacts the guiding concavity 317. Moreover, the first mating surface 311 and the adjacent second mating surface 312 respectively arranged on the any two buckled joints 3 have an angle, which is substantially equal to an angle defined by the first mating surface 311 and the second mating surface 312 of each of the joints 3.

As shown in FIG. 16, when the hinge module 1 is at the outwardly folded position, in any two buckled joints 3, the buckling portion 32 is entirely arranged in the corresponding track groove 316, the hook 321 is arranged away from the stopping ridge 3161, the top surface of the guiding protrusion 33 entirely contacts the guiding concavity 317, and the first mating surface 311 of one of the any two buckled joints 3 is stacked on the adjacent second mating surface 312 of the other joint 3.

It should be noted that when the hinge module 1 is at the unfolded position, the modular joint assembly 30 forms a straight line. Moreover, when the hinge module 1 is at the outwardly folded position, the modular joint assembly 30 has an arced structure, and the length of the imaginary datum line S of the modular joint assembly 30 at the outwardly folded position is equal to that of the imaginary datum line S of the modular joint assembly 30 at the unfolded position.

In other words, the length of the imaginary datum line S of the modular joint assembly 30 is always unchanged when the modular joint assembly 30 is operated between the outwardly folded position and the unfolded position, so that the space of the inner side of the imaginary datum line S is reduced. Accordingly, the present embodiment can satisfy the above condition by entirely arranging each guiding protrusion 33 in the corresponding guiding concavity 317 and stacking the first mating surface 311 and the adjacent second mating surface 312, the latter two of which are respectively arranged on any two buckled joints 3.

In addition, the number of the joints 3 of the modular joint assembly 30 is not limited to the figures and can be adjusted according to designer needs.

As shown in FIG. 11, the two external connecting members 22 are respectively installed on two of the joints 3 arranged on two opposite ends of the modular joint assembly 30 in a movable or unmovable manner. As shown in FIGS. 11, 15 and 16, the second cover 222 of each of the external connecting members 22 in the present embodiment includes two auxiliary mating surfaces 2221 arranged close to the pivots 11 and arranged at two opposite sides of the corresponding plate 211. The second cover 222 has an arced auxiliary track groove 2222 and an arced auxiliary guiding concavity 2223 both recessed on one of the two auxiliary mating surfaces 2221 thereof, and the second cover 222 also has an arced auxiliary buckling portion 2224 and an arced auxiliary guiding protrusion 2225 both extending from the other auxiliary mating surface 2221 thereof.

The auxiliary track groove 2222 and the auxiliary guiding concavity 2223 are respectively installed to the buckling portion 32 and the guiding protrusion 33 of the joint 3 arranged on one end of the modular joint assembly 30, and the auxiliary buckling portion 2224 and the auxiliary guiding protrusion 2225 are respectively installed to the track groove 316 and the guiding concavity 317 of the joint 3 arranged on the other end of the modular joint assembly 30, such that the second cover 222 of each of the two external connecting members 22 is configured to rotate with respect to the corresponding joint 3.

Specifically, the auxiliary track groove 2222, the auxiliary guiding concavity 2223, the auxiliary buckling portion 2224, and the auxiliary guiding protrusion 2225 in the present embodiment are respectively identical to the track groove 316, the guiding concavity 317, the buckling portion 32, and the guiding protrusion 33 of each of the joints 3. The cooperation of each second cover 222 and the corresponding joint 3 in the present embodiment is substantially identical to that of any two buckled joints 3. Moreover, the imaginary datum line S of the modular joint assembly 30 can be defined by further connecting the center of circle C' of the auxiliary track groove 2222. That is to say, the imaginary datum line S can also be defined by connecting the center of circles C of the modular joint assembly 30 and the center of circle C' of the auxiliary track groove 2222, but the present disclosure is not limited thereto.

The modular joint assembly 30 of the present embodiment has been disclosed in the above description, and the following description discloses the relationships between the modular joint assembly 30 and the other components. As shown in FIG. 11, one ends of the connecting tubes 200 (i.e., the left end as shown in FIG. 11) are respectively inserted into (the stopping blocks 31a of) the joints 3 of the modular joint assembly 30 of one of the two supporting devices 100, and the other ends of the connecting tubes 200 (i.e., the right end as shown in FIG. 11) are respectively inserted into (the stopping blocks 31a of) the joints 3 of the modular joint assembly 30 of the other supporting device 100. Thus, the two supporting devices 100 can be smoothly operated at the same time by using the connecting tubes 200.

The bendable display 400 is mounted on the cushion sheet 301, the central metal sheet 302, and the two side metal sheets 303 of the carrying plate 200 and is arranged at the imaginary datum line S of each of the modular joint assemblies 30 (i.e., the center of circle C of each of the track grooves 315 is located at the bendable display 400).

In summary, the bendable display 400 is arranged at the imaginary datum line S (i.e., the imaginary datum line S located at the center of the bendable display 400), so that the bendable display 400 and the imaginary datum line S are bent synchronously. In other words, the bendable display 400 is arranged on all of the rotating axes of the modular joint assembly 30, and the bendable display 400 is configured to rotate along the rotating axes. Therefore, the supporting device 100 does not stretch or compress the bendable display 400, thereby reducing a damage probability of the bendable display 400.

The descriptions illustrated supra set forth simply the preferred embodiments of the present disclosure; however, the characteristics of the present disclosure are by no means restricted thereto. All changes, alterations, or modifications conveniently considered by those skilled in the art are deemed to be encompassed within the scope of the present disclosure delineated by the following claims.

What is claimed is:

1. A bendable display apparatus, comprising:
    two supporting devices each including:
        a hinge module, including:
            a plurality of pivots parallel to each other and arranged in a row, wherein two spiral tracks are respectively recessed on two opposite portions of the pivots; and
            a plurality of torsion units sleeved on the pivots, wherein two positioning portions are respectively arranged on two opposite portions of the torsion units; and
        two buffering modules respectively arranged at two opposite sides of the row of the pivots and respectively fixed on the two positioning portions, the two buffering modules respectively corresponding in position to the two spiral tracks, each of the two buffering modules including:
            an internal connecting member fixed on the corresponding positioning portion;
            an external connecting member slidably disposed on the internal connecting member;
            a transmitting shaft having a gearing portion and a fixing portion, wherein the gearing portion is pivotally connected to the internal connecting member, and the fixing portion is connected to the external connecting member; and
            a driving member having a rack gear and a guiding portion, wherein the rack gear is engaged with the gearing portion, and the guiding portion is arranged in the corresponding spiral track;
        wherein in each of the two supporting devices, the hinge module is bendable between an unfolded position and an outwardly folded position along at least one of the pivots; when the hinge module is at the unfolded position, the supporting device is a flat structure; when the hinge module is at the outwardly folded position, the supporting device is a curved structure; in each of the buffering modules, when the hinge module is bent from the unfolded position to the outwardly folded position, the guiding portion is moved by the corresponding spiral track to cause that the rack gear rotates the gearing portion of the transmitting member, and the fixing portion of the transmitting member drives the external connecting member to slide relative to the internal connecting member toward the row of the pivots;
    a carrying plate fixed on the external connecting members of the two supporting devices; and
    a bendable display mounted on the carrying plate, wherein when each of the two buffering modules is rotated to the outwardly folded position, the two supporting devices are arranged inside of the bendable display.

2. The bendable display apparatus as claimed in claim 1, wherein the carrying plate includes:
    a cushion sheet having a first side and an opposite second side, wherein the two supporting devices are disposed on the first side of the cushion sheet;
    a central metal sheet fixed on the second side of the cushion sheet; and
    two side metal sheets fixed on the second side of the cushion sheet and respectively arranged at two opposite sides of the central metal sheet,
    wherein the central metal sheet and each of the two side metal sheets have a gap there-between, and the gaps are fully filled with the cushion sheet.

3. The bendable display apparatus as claimed in claim 2, wherein each of the two side metal sheets has a first end portion and an opposite second end portion, the first end portions of the two side metal sheets are configured to respectively correspond in position to the external connecting members of the two buffering modules of one of the two supporting devices, and the second end portions of the two side metal sheets are configured to respectively correspond in position to the external connecting members of the two buffering modules of the other supporting device.

4. The bendable display apparatus as claimed in claim 1, wherein each of the two supporting devices includes a plurality of joints detachably buckled in sequence; in each of the two supporting devices, two opposite ends of the joints are respectively installed on the two external connecting members, and at least one of the joints is fixed on at least one of the pivots, wherein each of the joints includes:
    a main portion having a first mating surface, an opposite second mating surface, an inner surface connected to an edge of the first mating surface and an edge of the second mating surface, and an outer surface connected to the other edge of the first mating surface and the other edge of the second mating surface, wherein a distance between the first mating surface and the second mating surface gradually increases in a direction from the inner surface to the outer surface, the main portion has an arced track groove recessed on the first mating surface, and a center of circle of the track groove is located at the bendable display; and a buckling portion extending from the second mating surface, wherein in any two buckled joints, the buckling portion of one of the any two buckled joints is arranged in the track groove of the other joint, and the any two buckled joints are rotatable relative to each other; wherein an imaginary datum line is defined by connecting the centers of the track grooves, and when each of the two hinge modules is bent between the unfolded position and the outwardly folded position, a length of the imaginary datum line is unchanged.

5. The bendable display apparatus as claimed in claim 4, wherein in each of the two supporting devices, when the hinge module is at the outwardly folded position, the first mating surface of one of the any two buckled joints is stacked on the adjacent second mating surface of the other joint.

6. The bendable display apparatus as claimed in claim 4, wherein each of the two supporting devices further includes a spring; in each of the two supporting devices, two opposite ends of the spring are respectively fixed on the two external connecting members, and the spring is wedged in the joints.

7. The bendable display apparatus as claimed in claim 1, wherein in each of the buffering modules, the driving member has a U-shaped plate, a portion of the internal connecting member is inserted into the U-shaped plate, and the rack gear and the guiding portion are respectively connected to two opposite sides of the U-shaped plate.

8. A supporting device, comprising:

a hinge module, including:

a plurality of pivots parallel to each other and arranged in a row, wherein two spiral tracks are respectively recessed on two opposite portions of the pivots; and a plurality of torsion units sleeved on the pivots, wherein two positioning portions are respectively arranged on two opposite portions of the torsion units; and two buffering modules respectively arranged at two opposite sides of the row of the pivots and respectively fixed on the two positioning portions, the two buffering modules respectively corresponding in position to the two spiral tracks, each of the two buffering modules including:

an internal connecting member fixed on the corresponding positioning portion;

an external connecting member slidably disposed on the internal connecting member;

a transmitting shaft having a gearing portion and a fixing portion, wherein the gearing portion is pivotally connected to the internal connecting member, and the fixing portion is connected to the external connecting member; and a driving member having a rack gear and a guiding portion, wherein the rack gear is engaged with the gearing portion, and the guiding portion is arranged in the corresponding spiral track;

wherein the hinge module is bendable between an unfolded position and an outwardly folded position along at least one of the pivots; when the hinge module is at the unfolded position, the supporting device is a flat structure; when the hinge module is at the outwardly folded position, the supporting device is a curved structure; in each of the buffering modules, when the hinge module is bent from the unfolded position to the outwardly folded position, the guiding portion is moved by the corresponding spiral track to cause that the rack gear rotates the gearing portion of the transmitting member, and the fixing portion of the transmitting member drives the external connecting member to slide relative to the internal connecting member toward the row of the pivots.

9. The supporting device as claimed in claim 8, further comprising a plurality of joints detachably buckled in sequence and a spring wedged in the joints, two opposite ends of the joints are respectively installed on the two external connecting members, at least one of the joints is fixed on at least one of the pivots, and two opposite ends of the spring are respectively fixed on the two external connecting members.

10. The supporting device as claimed in claim 8, wherein in each of the buffering modules, the driving member has a U-shaped plate, a portion of the internal connecting member is inserted into the U-shaped plate, and the rack gear and the guiding portion are respectively connected to two opposite sides of the U-shaped plate.

* * * * *